(12) United States Patent
Kurokawa

(10) Patent No.: US 8,586,905 B2
(45) Date of Patent: Nov. 19, 2013

(54) SEMICONDUCTOR DEVICE AND DRIVING METHOD THEREOF

(75) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 363 days.

(21) Appl. No.: 13/021,144

(22) Filed: Feb. 4, 2011

(65) Prior Publication Data

US 2011/0198483 A1  Aug. 18, 2011

(30) Foreign Application Priority Data

Feb. 12, 2010  (JP) ................. 2010-028762

(51) Int. Cl.
*H03F 3/08* (2006.01)
*H01L 27/00* (2006.01)
*G09G 5/00* (2006.01)
*G09G 3/04* (2006.01)
*G02F 1/1345* (2006.01)

(52) U.S. Cl.
USPC .......... 250/214 R; 250/214.1; 345/4; 345/40; 349/151

(58) Field of Classification Search
USPC ............ 250/214 R, 214.1, 208.1; 345/4–6, 345/38–40, 44–46, 50, 51, 55, 84, 90, 104; 349/140, 151
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,051,857 A | 4/2000 | Miida |
| 6,294,274 B1 | 9/2001 | Kawazoe et al. |
| 6,512,547 B1 | 1/2003 | Miida |
| 6,563,174 B2 | 5/2003 | Kawasaki et al. |

(Continued)

FOREIGN PATENT DOCUMENTS

| | | |
|---|---|---|
| EP | 0 978 878 | 2/2000 |
| EP | 1737044 A | 12/2006 |

(Continued)

OTHER PUBLICATIONS

Nakayama et al., "17a-Tl-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(Continued)

*Primary Examiner* — Georgia Y Epps
*Assistant Examiner* — Don Williams
(74) *Attorney, Agent, or Firm* — Eric J. Robinson; Robinson Intellectual Property Law Office, P.C.

(57) ABSTRACT

A semiconductor device including photosensor capable of imaging with high resolution is disclosed. The semiconductor device includes the photosensor having a photodiode, a first transistor, and a second transistor. The photodiode generates an electric signal in accordance with the intensity of light. The first transistor stores charge in a gate thereof and converts the stored charge into an output signal. The second transistor transfers the electric signal generated by the photodiode to the gate of the first transistor and holds the charge stored in the gate of the first transistor. The first transistor has a back gate and the threshold voltage thereof is changed by changing the potential of the back gate.

20 Claims, 10 Drawing Sheets

(56) References Cited

U.S. PATENT DOCUMENTS

| | | | |
|---|---|---|---|
| 6,727,522 B1 | 4/2004 | Kawasaki et al. |
| 6,747,638 B2 | 6/2004 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,238,554 B2 * | 7/2007 | Schuele et al. | 438/149 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,417,268 B2 | 8/2008 | Cazaux et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,525,523 B2 | 4/2009 | Yamazaki et al. |
| 7,601,984 B2 | 10/2009 | Sano et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,081,175 B2 * | 12/2011 | Chen | 345/207 |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2010/0044711 A1 | 2/2010 | Imai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0182282 A1 | 7/2010 | Kurokawa et al. |
| 2010/0320458 A1 | 12/2010 | Umeda et al. |
| 2010/0320459 A1 | 12/2010 | Umeda et al. |
| 2011/0043488 A1 | 2/2011 | Kurokawa et al. |
| 2011/0109532 A1 * | 5/2011 | Choi | 345/76 |
| 2011/0176038 A1 | 7/2011 | Kurokawa et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |

FOREIGN PATENT DOCUMENTS

| | | |
|---|---|---|
| EP | 2 157 615 | 2/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-195778 | 7/1999 |
| JP | 2000-044236 A | 2/2000 |
| JP | 2000-150900 A | 5/2000 |
| JP | 2001-292276 A | 10/2001 |
| JP | 2002-076356 A | 3/2002 |
| JP | 2002-246580 A | 8/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-105381 A | 5/2009 |
| JP | 2009-206508 | 9/2009 |
| JP | 2009-231613 | 10/2009 |
| JP | 2009-535819 | 10/2009 |
| JP | 2010-016347 | 1/2010 |
| JP | 4415062 | 2/2010 |
| JP | 2010-067954 | 3/2010 |
| JP | 2010-074138 | 4/2010 |
| JP | 2010-177431 | 8/2010 |

(56) References Cited

FOREIGN PATENT DOCUMENTS

| JP | 4571221 | 10/2010 |
|---|---|---|
| JP | 2012-160679 | 8/2012 |
| WO | WO-2004/114391 | 12/2004 |
| WO | WO 2008/027392 | 3/2008 |
| WO | WO-2008/133345 | 11/2008 |
| WO | WO 2009/096608 | 8/2009 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physical Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Synthesis and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector with Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The"Blue Phase",", Physics Letters, Sep. 10, 1973, vol. 45A, No. 2, pp. 115-116.

Cho.D et al., "21.2:Al and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display with Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amophous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs with a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2011/050793) dated Apr. 5, 2011.

Written Opinion (Application No. PCT/JP2011/050793) dated Apr. 5, 2011.

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507.

* cited by examiner

SEMICONDUCTOR DEVICE AND DRIVING METHOD THEREOF

TECHNICAL FIELD

The present invention relates to a semiconductor device including a photosensor and a driving method thereof. The present invention also relates to a semiconductor device in which photosensors are arranged in a matrix and a driving method thereof. Further, the present invention relates to a display device including a photosensor and a driving method thereof. The present invention also relates to a display device in which pixels each including a photosensor are arranged in a matrix and a driving method thereof. In addition, the present invention relates to an electronic appliance including the display device or the semiconductor device.

BACKGROUND ART

In recent years, display devices on which a sensor that detects light (also referred to as a "photosensor") is mounted have attracted attention. By providing a display device with a photosensor, input of information can be performed on a display screen. For example, a display device having an image capturing function can be given (for example, see Patent Document 1).

In addition to the above display device, as a semiconductor device including a photosensor, an imaging device which is used in an electronic appliance such as a scanner or a digital still camera can be given.

In a semiconductor device including a photosensor such as the above display device or the imaging device, the photosensor detects light reflected by an object or light emitted from an object; thus, the semiconductor device can detect the presence of the object around a region in which the photosensor is provided.

[Reference]
[Patent Document]
[Patent Document 1] Japanese Published Patent Application No. 2001-292276

DISCLOSURE OF INVENTION

In order that an object to be detected be imaged and an image be obtained, light needs to be converted into an electric signal in a photosensor. Since the electric signal is an analog signal in general, the electric signal needs to be converted into a digital signal by an A/D converter circuit. Further, A/D conversion in accordance with the intensity of light needs to be performed.

Therefore, an object of an embodiment of the present invention is to accurately convert light into an electric signal in a photosensor. Another object is to provide a photosensor with a novel circuit structure for achieving the above object. Another object is to provide a semiconductor device including the photosensor.

Further, another object is to provide a photosensor capable of imaging with high resolution. Another object is to provide a semiconductor device including the photosensor.

Another object is to provide a semiconductor device including a photosensor capable of imaging an object to be detected which moves fast without blur or distortion in an image.

Further, it is another object to provide a semiconductor device including a photosensor capable of imaging with high resolution with low power consumption.

An embodiment of the present invention relates to a semiconductor device which includes a photosensor having a photodiode, a first transistor, and a second transistor. The photodiode has a function of generating an electric signal in accordance with the intensity of light. The first transistor has a function of storing charge in a gate of the first transistor. The second transistor has a function of transferring the electric signal generated by the photodiode to the gate of the first transistor. The second transistor has a function of holding the charge stored in the gate of the first transistor.

In the above structure, the first transistor has a back gate. In the first transistor, the threshold voltage can be changed by changing the potential of the back gate.

In the above structure, the first transistor has a function of converting the charge stored in the gate into an output signal. The charge stored in the gate of the first transistor is converted into an output signal and the output signal is read, whereby an electric signal in accordance with the intensity of light can be output. Reading of the charge stored in the gate of the first transistor is performed a plurality of times while the potential of the back gate of the first transistor is changed with the charge stored in the gate held. Specifically, the potential of the back gate of the first transistor is set at a first potential and the charge stored in the gate of the first transistor is converted into a first output signal and the first output signal is read. Then, the potential of the back gate of the first transistor is set at a second potential and the charge stored in the gate of the first transistor is converted into a second output signal and the second output signal is read. In the case where reading is performed three times or more, the above-described operation may be performed repeatedly. In this manner, reading of the charge stored in the gate of the first transistor can be performed a plurality of times while the potential of the back gate of the first transistor is changed.

Thus, even when the intensity of light is high, an electric signal in accordance with the intensity of light can be output. Further, even when the intensity of light is low, an electric signal in accordance with the intensity of light can be output.

In the above structure, a channel formation region of at least the second transistor can be formed using an oxide semiconductor layer. A transistor using an oxide semiconductor has an electric characteristic of extremely low off current when compared with a transistor using silicon or the like.

Therefore, by using an oxide semiconductor layer in the channel formation region of the second transistor, the charge stored in the gate of the first transistor can be held for a long time. Accordingly, the charge stored in the gate of the first transistor can be held almost constant in a period during which reading of the charge stored in the gate of the first transistor is performed a plurality of times.

In the above structure, the semiconductor device includes a third transistor. The third transistor has a function of controlling reading of the output signal.

In the above structure, the semiconductor device includes a fourth transistor. The fourth transistor has a function of controlling the potential of a signal line which is used for reading the output signal. Specifically, the fourth transistor has a function of setting the potential of the signal line at a reference potential.

According to an embodiment of the present invention, a semiconductor device including a photosensor capable of outputting an electric signal in accordance with a wide range of intensity of light can be provided. That is, it is possible to accurately convert light, regardless of the intensity thereof, into an electric signal. Therefore, a semiconductor device can be provided which includes a photosensor capable of realizing an imaging function with high resolution and applicability to a wide range of intensity of light in low cost.

BEST MODE FOR CARRYING OUT THE INVENTION

Figure 1:
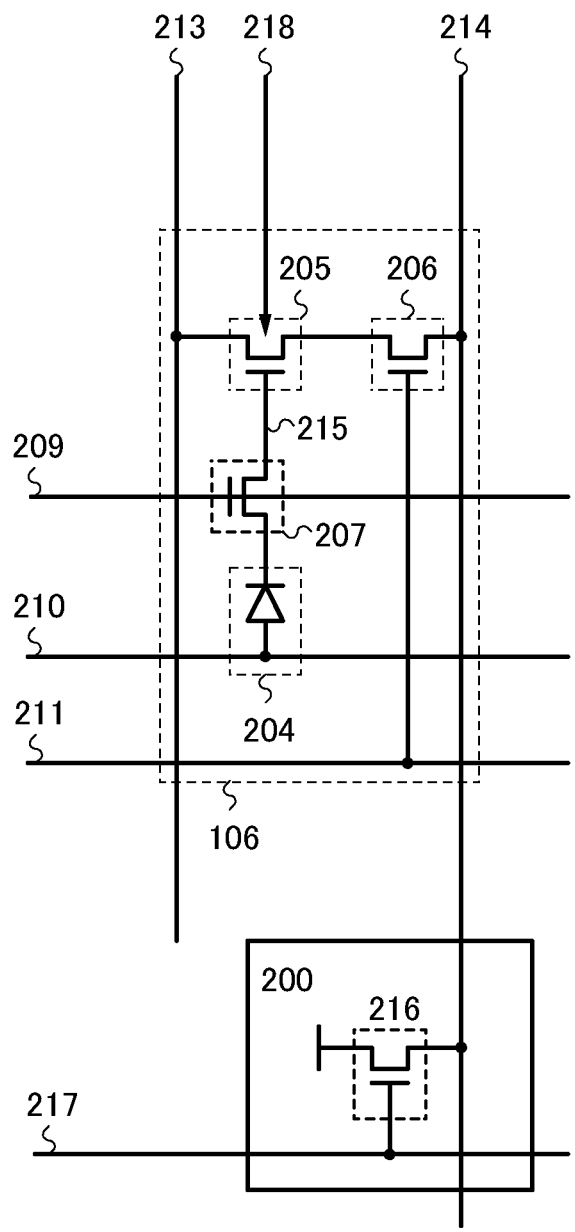
FIG. 1 is a diagram illustrating an example of a structure of a semiconductor device.

Hereinafter, embodiments will be described in detail with reference to the accompanying drawings. However, since embodiments described below can be embodied in many different modes, it is easily understood by those skilled in the art that the mode and the detail can be variously changed without departing from the scope of the present invention. Therefore, the present invention is not interpreted as being limited to the description of the embodiments below. In the drawings for explaining the embodiments, the same part or part having a similar function are denoted by the same reference numerals, and description of such part is not repeated.
(Embodiment 1)

In this embodiment, an example of a semiconductor device which is an embodiment of the disclosed invention is described with reference to FIG. 1.

An example of a circuit structure of a photosensor 106 included in the semiconductor device is illustrated in FIG. 1. An example of a structure of a precharge circuit 200 which is electrically connected to the photosensor 106 is also illustrated.

The photosensor 106 includes a photodiode 204, a transistor 205, a transistor 206, and a transistor 207.

In the photosensor 106, one electrode of the photodiode 204 is electrically connected to a photodiode reset signal line 210, and the other electrode of the photodiode 204 is electrically connected to one of a source and a drain of the transistor 207. One of a source and a drain of the transistor 205 is electrically connected to a photosensor reference signal line 213, and the other of the source and the drain of the transistor 205 is electrically connected to one of a source and a drain of the transistor 206. A gate of the transistor 206 is electrically connected to a gate signal line 211, and the other of the source and the drain of the transistor 206 is electrically connected to a photosensor output signal line 214. A gate of the transistor 207 is electrically connected to a gate signal line 209. The other of the source and the drain of the transistor 207 is electrically connected to a gate of the transistor 205 through a gate signal line 215.

The transistor 205 has a back gate. The back gate is electrically connected to a back gate signal line 218. By changing a potential applied to the back gate signal line 218, the potential of the back gate of the transistor 205 can be changed. By changing the potential of the back gate, the threshold voltage of the transistor 205 can be changed. The transistor 205 has a structure in which the gate, a gate insulating layer, a semiconductor layer including a channel formation region, an insulating film, and the back gate are stacked. The insulating film functions as a gate insulating layer on the back gate side. The gate and the back gate are positioned so that the channel formation region is interposed therebetween. The back gate can be formed using a conductive film similarly to the gate.

The gate signal line 209, the photodiode reset signal line 210, and the gate signal line 211 are electrically connected to a photosensor driver circuit. The photosensor driver circuit has a function of performing a reset operation, an accumulation operation, and a reading operation, which are described below, on the photosensor 106 arranged in a specified row.

The photosensor output signal line 214, the photosensor reference signal line 213, and the back gate signal line 218 are electrically connected to a photosensor reading circuit. The photosensor reading circuit has a function of reading an output signal from the photosensor 106 in a selected row.

Note that the photosensor reading circuit can have a structure in which an output from the photosensor which is an analog signal is extracted as an analog signal to the outside by an OP amplifier; or a structure in which the output is converted into a digital signal by an A/D converter circuit and then extracted to the outside.

As the photodiode 204, a PN diode, a PIN diode, a Schottky diode, or an avalanche diode can be used. In the case where the PN diode or the PIN diode is used, a structure in which semiconductors having the corresponding conductivity type (p-type conductivity and n-type conductivity, or p-type conductivity, i-type conductivity, and n-type conductivity) are stacked can be employed. Alternatively, a structure in which semiconductors each having a conductivity type are positioned on the coplanar surface can be used. A semiconductor contained in the photodiode 204 can be an amorphous semiconductor, a microcrystalline semiconductor, a polycrystalline semiconductor, a single crystal semiconductor, or the like. The photodiode has a function of generating an electric signal in accordance with the intensity of light. Light which is received by the photodiode is light reflected by an object or light emitted from an object. As a light source of the light reflected by the object, a lighting device included in the semiconductor device or external light can be used.

The transistor 207 has a function of controlling the accumulation operation performed on the photosensor. That is, the transistor 207 in a conduction state has a function of transferring the electric signal generated by the photodiode 204 to the gate of the transistor 205. Therefore, a transistor with high mobility is desirably used as the transistor 207. In addition, the transistor 207 in a non-conduction state has a function of holding charge stored (accumulated) in the gate of the transistor 205. Thus, a transistor with extremely low off current is desirably used as the transistor 207.

Therefore, as a semiconductor contained in a channel formation region of the transistor 207, an oxide semiconductor with extremely low off current and comparatively high mobility is desirably used. A transistor using an oxide semiconductor has an electric characteristic of extremely low off current when compared with a transistor using silicon or the like. A transistor using an oxide semiconductor has an electric characteristic of higher mobility than a transistor using amorphous silicon.

The transistor 205 has a function of storing (accumulating) charge in the gate. By converting the charge stored in the gate into an output signal and reading the output signal from the photosensor output signal line 214, the electric signal generated by the photodiode 204 can be read as the output signal. Reading of the charge stored in the gate of the transistor 205 is performed a plurality of times while the potential of the back gate of the transistor 205 is changed with the charge stored in the gate of the transistor 205 held.

Accordingly, the photosensor 106 capable of outputting an electric signal in accordance with a wide range of intensity of light can be provided. That is, it is possible to accurately convert light, regardless of the intensity thereof, into an electric signal.

In order to perform the above-described reading at high speed, a transistor with high mobility is desirably used as the transistor 205.

The transistor 206 has a function of controlling reading of the output signal from the photosensor 106. Specifically, the transistor 206 has a function of transferring the output signal from the photosensor 106 to the photosensor output signal line 214. In order to perform transferring of the output signal at high speed, i.e., in order to perform high reading of the output signal from the photosensor 106 at high speed, it is desirable that a transistor with high mobility be used as the transistor 206.

On the other hand, during a reading period for another pixel, it is necessary to prevent an unnecessary potential from being output to the photosensor output signal line 214. Therefore, it is desirable that a transistor with low off current be used as one or both of the transistor 205 and the transistor 206.

Thus, in the case where high-speed reading is prioritized, a single crystal semiconductor, a polycrystalline semiconductor, or the like is desirably used as a semiconductor contained in a channel formation region of the transistors 205 and 206. Further, it is desirable to use a material (e.g., silicon) whose crystallinity is easily improved.

Moreover, in the case of prioritizing preventing an unnecessary potential from being output, an oxide semiconductor with extremely low off current and comparatively high mobility is desirably used as a semiconductor contained in the channel formation region of one or both of the transistor 205 and the transistor 206.

As described above, semiconductor materials used for the transistor 205 and the transistor 206 can be selected depending on the characteristics needed for the photosensor 106.

Next, the precharge circuit 200 is described. The precharge circuit 200 illustrated in FIG. 1 is used for pixels per column. The precharge circuit 200 used for the pixels per column includes a transistor 216 and a precharge signal line 217. A gate of the transistor 216 is electrically connected to the precharge signal line 217; one of a source and a drain of the transistor 216 is electrically connected to a signal line to which a predetermined potential is supplied; and the other of the source and the drain of the transistor 216 is electrically connected to the photosensor output signal line 214. Note that an OP amplifier or an A/D converter circuit can be connected to a subsequent stage of the precharge circuit 200.

In the precharge circuit 200, before the operation of the photosensor in the pixel, the potential of the photosensor output signal line 214 is set at a reference potential. For example, when a high potential is applied to the precharge signal line 217, the transistor 216 is turned on and the photosensor output signal line 214 can be set at the reference potential (the high potential here). Note that it is effective to provide a storage capacitor for the photosensor output signal line 214 so that the potential of the photosensor output signal line 214 is stabilized. Note that the reference potential can be set at a low potential.

According to this embodiment, a low-cost semiconductor device capable of realizing an imaging function with high resolution and applicability to a wide range of intensity of light can be provided.

Such a semiconductor device including a photosensor can be used in an electronic appliance such as a scanner or a digital still camera. In addition, the semiconductor device including the photosensor can be used in a display device having a touch panel function.

This embodiment can be implemented in combination with any of other embodiments and an example as appropriate.

(Embodiment 2)

In this embodiment, an example of a semiconductor device which is an embodiment of the disclosed invention is described with reference to FIG. 2 and FIG. 3. An example in which the semiconductor device is a display device is described in this embodiment.

Figure 2:
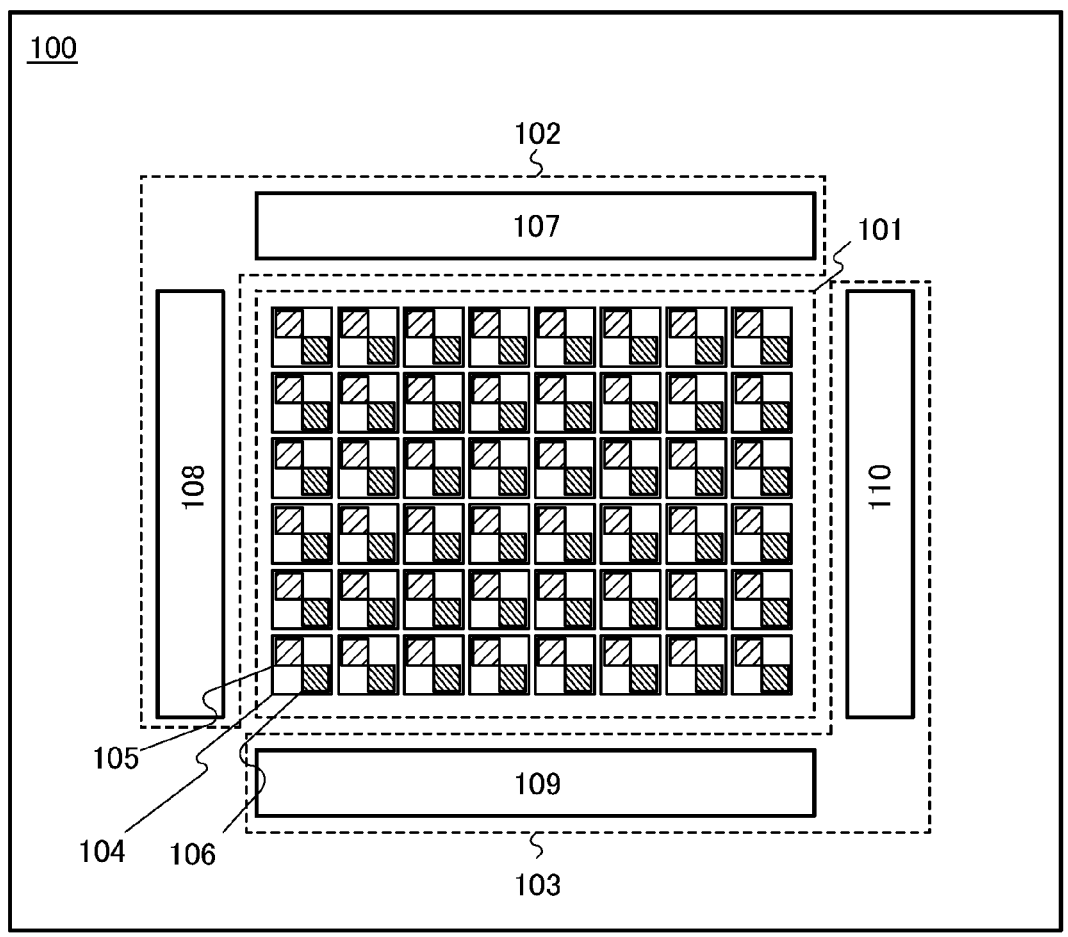
FIG. 2 is a diagram illustrating an example of a structure of a display device.

An example of a structure of a display device is illustrated in FIG. 2. A display device 100 includes a pixel circuit 101, a display element control circuit 102, and a photosensor control circuit 103. The pixel circuit 101 includes a plurality of pixels 104 arranged in a matrix in a row direction and a column direction. Each of the pixels 104 includes a display element 105 and a photosensor 106. The photosensor 106 is not necessarily provided in each of the pixels 104, and may be provided in every two or more pixels. For example, a structure in which one photosensor is provided per two pixels may be employed. Alternatively, the photosensor may be provided outside the pixel 104.

The display element control circuit 102 is a circuit controlling the display element 105, and includes a display element driver circuit 107 from which a signal such as a video data is input to the display element 105 through a signal line (also referred to as a video-data signal line or a source signal line); and a display element driver circuit 108 from which a signal is input to the display element 105 through a scan line (also referred to as a gate signal line).

The photosensor control circuit 103 is a circuit controlling the photosensor 106, and includes a photosensor reading circuit 109 on the signal line side and a photosensor driver circuit 110 on the scan line side.

Figure 3:
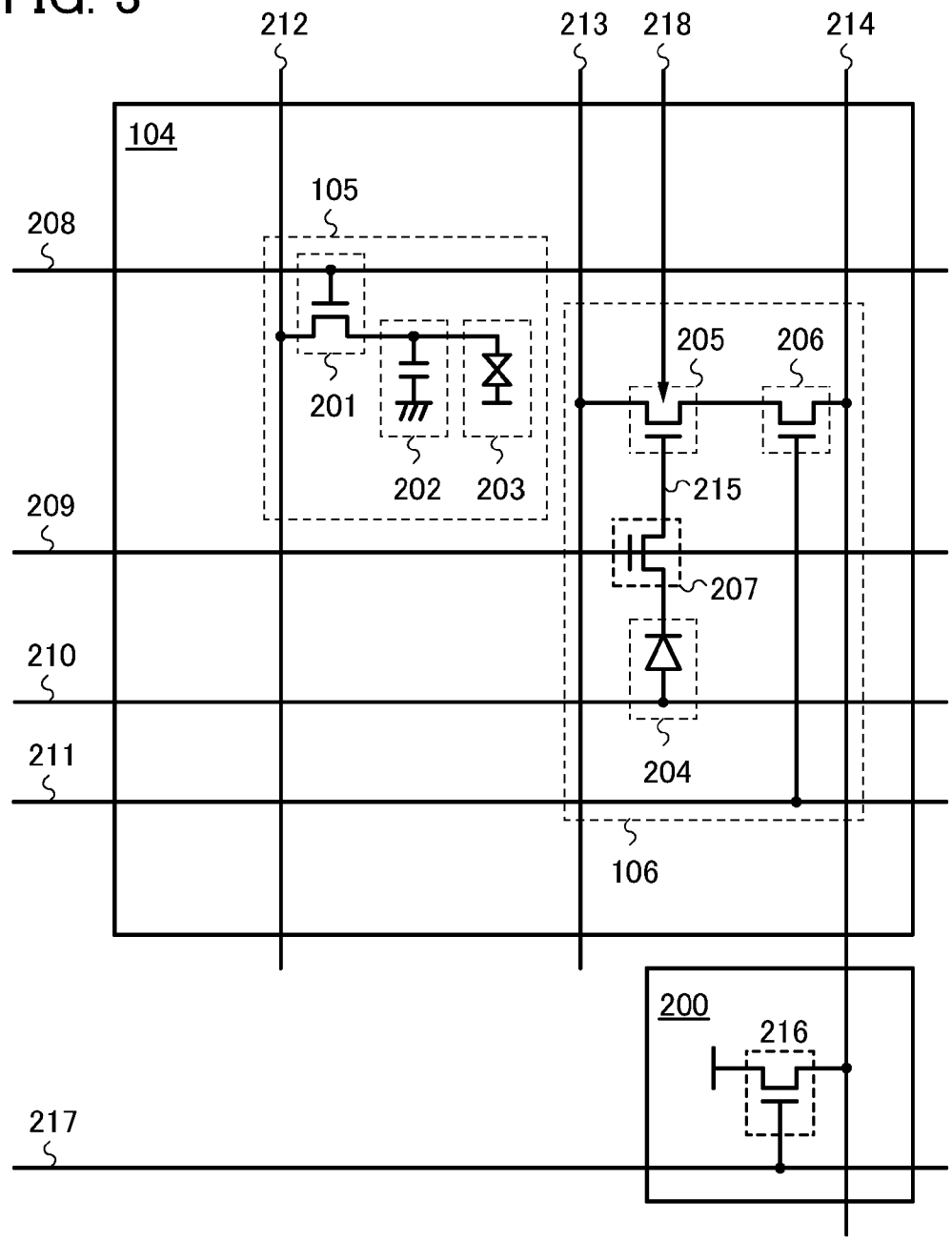
FIG. 3 is a diagram illustrating an example of a circuit structure of a pixel included in a display device.

In FIG. 3, an example of a circuit structure of the pixel 104 is illustrated. An example of a structure of the precharge circuit 200 which is electrically connected to the pixel 104 is also illustrated. The precharge circuit 200 is included in the photosensor reading circuit 109 which is illustrated in FIG. 2.

The pixel 104 includes the display element 105 and the photosensor 106. The display element 105 includes a transistor 201, a storage capacitor 202, and a liquid crystal element 203.

In the display element 105, a gate of the transistor 201 is electrically connected to a gate signal line 208, one of a source and a drain of the transistor 201 is electrically connected to a video data signal line 212, and the other of the source and the drain of the transistor 201 is electrically connected to one electrode of the storage capacitor 202 and one electrode of the liquid crystal element 203. The other electrode of the storage capacitor 202 and the other electrode of the liquid crystal element 203 are electrically connected to a common wiring supplied with a predetermined potential. The liquid crystal element 203 is an element including a pair of electrodes and a liquid crystal layer interposed between the pair of electrodes.

The transistor 201 has a function of controlling injection or ejection of charge into or from the liquid crystal element 203 and the storage capacitor 202. For example, when a high potential is applied to the gate signal line 208, the transistor 201 is turned on and the potential of the video data signal line 212 is applied to the liquid crystal element 203 and the storage capacitor 202. The contrast (gray scale) of light passing through the liquid crystal element 203 is made due to voltage application to the liquid crystal element 203, whereby image display is realized. The storage capacitor 202 has a function of maintaining voltage applied to the liquid crystal element 203. The display device 100 which includes the liquid crystal element 203 can be a transmissive display device, a reflective display device, or a semi-transmissive display device.

The video data signal line 212 is electrically connected to the display element driver circuit 107 which is illustrated in FIG. 2. The display element driver circuit 107 is a circuit which supplies a signal to the display element 105 through the video data signal line 212. The gate signal line 208 is electrically connected to the display element driver circuit 108 which is illustrated in FIG. 2. The display element driver circuit 108 is a circuit which supplies a signal to the display element 105 through the gate signal line 208. For example, the display element driver circuit 108 has a function of supplying a signal which selects a display element included in a pixel arranged in a specified row. The display element driver circuit 107 has a function of supplying a signal which supplies appropriate potentials to a display element included in a pixel in a selected row.

As a semiconductor contained in a channel formation region of the transistor 201, an amorphous semiconductor, a microcrystalline semiconductor, a polycrystalline semiconductor, an oxide semiconductor, a single crystal semiconductor, or the like can be used. In particular, display quality can be improved by using an oxide semiconductor to obtain a transistor with extremely low off current.

Although the display element 105 described here includes the liquid crystal element, the display element 105 may include another element such as a light emitting element. The light emitting element is an element whose luminance is controlled with current or voltage, and specific examples thereof are a light emitting diode and an OLED (organic light emitting diode).

The photosensor 106 includes the photodiode 204, the transistor 205, the transistor 206, and the transistor 207.

In the photosensor 106, one electrode of the photodiode 204 is electrically connected to the photodiode reset signal line 210, and the other electrode of the photodiode 204 is electrically connected to one of the source and the drain of the transistor 207. One of the source and the drain of the transistor 205 is electrically connected to the photosensor reference signal line 213, and the other of the source and the drain of the transistor 205 is electrically connected to one of the source and the drain of the transistor 206. The gate of the transistor 206 is electrically connected to the gate signal line 211, and the other of the source and the drain of the transistor 206 is electrically connected to the photosensor output signal line 214. The gate of the transistor 207 is electrically connected to the gate signal line 209. The other of the source and the drain of the transistor 207 is electrically connected to the gate of the transistor 205 through the gate signal line 215.

The transistor 205 has the back gate. The back gate is electrically connected to the back gate signal line 218. By changing a potential applied to the back gate signal line 218, the potential of the back gate of the transistor 205 can be changed. By changing the potential of the back gate, the threshold voltage of the transistor 205 can be changed. The transistor 205 has the structure in which the gate, the gate insulating layer, the semiconductor layer including the channel formation region, the insulating film, and the back gate are stacked. The insulating film functions as the gate insulating layer on the back gate side. The gate and the back gate are positioned so that the channel formation region is interposed therebetween. The back gate can be formed using a conductive film similarly to the gate.

The gate signal line 209, the photodiode reset signal line 210, and the gate signal line 211 are electrically connected to the photosensor driver circuit 110 which is illustrated in FIG. 2. The photosensor driver circuit 110 has a function of performing the reset operation, the accumulation operation, and the reading operation, which are described below, on the photosensor 106 included in a pixel arranged in a specified row.

The photosensor output signal line 214, the photosensor reference signal line 213, and the back gate signal line 218 are electrically connected to the photosensor reading circuit 109 which is illustrated in FIG. 2. The photosensor reading circuit 109 has a function of reading an output signal from the photosensor 106 included in a pixel in a selected row.

Note that the photosensor reading circuit 109 can have a structure in which an output from the photosensor which is an analog signal is extracted as an analog signal to the outside by an OP amplifier; or a structure in which the output is converted into a digital signal by an A/D converter circuit and then extracted to the outside.

As the photodiode 204, a PN diode, a PIN diode, a Schottky diode, or an avalanche diode can be used. In the case where the PN diode or the PIN diode is used, a structure in which semiconductors having the corresponding conductivity type (p-type conductivity and n-type conductivity, or p-type conductivity, i-type conductivity, and n-type conductivity) are stacked can be employed. Alternatively, a structure in which semiconductors each having a conductivity type are positioned on the coplanar surface can be used. A semiconductor contained in the photodiode 204 can be an amorphous semiconductor, a microcrystalline semiconductor, a polycrystalline semiconductor, a single crystal semiconductor, or the like. The photodiode has a function of generating an electric signal in accordance with the intensity of light. In the display device 100, light which is received by the photodiode is light reflected by an object or light emitted from an object. As a light source of the light reflected by the object, a lighting device included in the display device or external light can be used. In the case where a light emitting element is used as the display element 105 included in the display device, light emitted from the light emitting element can be utilized as the light source of the light reflected by the object.

The transistor 207 has a function of controlling the accumulation operation performed on the photosensor. That is, the transistor 207 in a conduction state has a function of transferring the electric signal generated by the photodiode 204 to the gate of the transistor 205. Therefore, a transistor with high mobility is desirably used as the transistor 207. In addition, the transistor 207 in a non-conduction state has a function of holding charge stored (accumulated) in the gate of the transistor 205. Thus, a transistor with extremely low off current is desirably used as the transistor 207.

Therefore, as a semiconductor contained in the channel formation region of the transistor 207, an oxide semiconductor with extremely low off current and comparatively high mobility is desirably used. A transistor using an oxide semiconductor has an electric characteristic of extremely low off current when compared with a transistor using silicon or the like. A transistor using an oxide semiconductor has an electric characteristic of higher mobility than a transistor using amorphous silicon.

Moreover, as described in Embodiment 1, semiconductor materials used for the transistor 205 and the transistor 206 can be selected depending on the characteristics needed for the photosensor 106.

Next, the precharge circuit 200 is described. The precharge circuit 200 illustrated in FIG. 3 is used for pixels per column. The precharge circuit 200 used for the pixels per column includes the transistor 216 and the precharge signal line 217. The gate of the transistor 216 is electrically connected to the precharge signal line 217; one of the source and the drain of the transistor 216 is electrically connected to a signal line to which a predetermined potential is supplied; and the other of the source and the drain of the transistor 216 is electrically connected to the photosensor output signal line 214. Note that an OP amplifier or an A/D converter circuit can be connected to a subsequent stage of the precharge circuit 200.

In the precharge circuit 200, before the operation of the photosensor in the pixel, the potential of the photosensor output signal line 214 is set at a reference potential. For example, when a high potential is applied to the precharge signal line 217, the transistor 216 is turned on and the photosensor output signal line 214 can be set at the reference potential (the high potential here). Note that it is effective to provide a storage capacitor for the photosensor output signal line 214 so that the potential of the photosensor output signal line 214 is stabilized. Note that the reference potential can be set at a low potential.

Although the display device including the photosensor is described in this embodiment, this embodiment can be easily applied to a semiconductor device including a photosensor, which does not have a display function. That is, the semiconductor device can be formed by removing the circuits necessary for display, specifically the display element control circuit 102 and the display element 105, from the display device 100 in this embodiment. As a semiconductor device including a photosensor, an imaging device which is used in an electronic appliance such as a scanner or a digital still camera can be given.

According to this embodiment, a low-cost display device or a low-cost semiconductor device which is capable of realizing an imaging function with high resolution and applicability to a wide range of intensity of light can be provided.

This embodiment can be implemented in combination with any of other embodiments and an example as appropriate.
(Embodiment 3)

Figure 4:
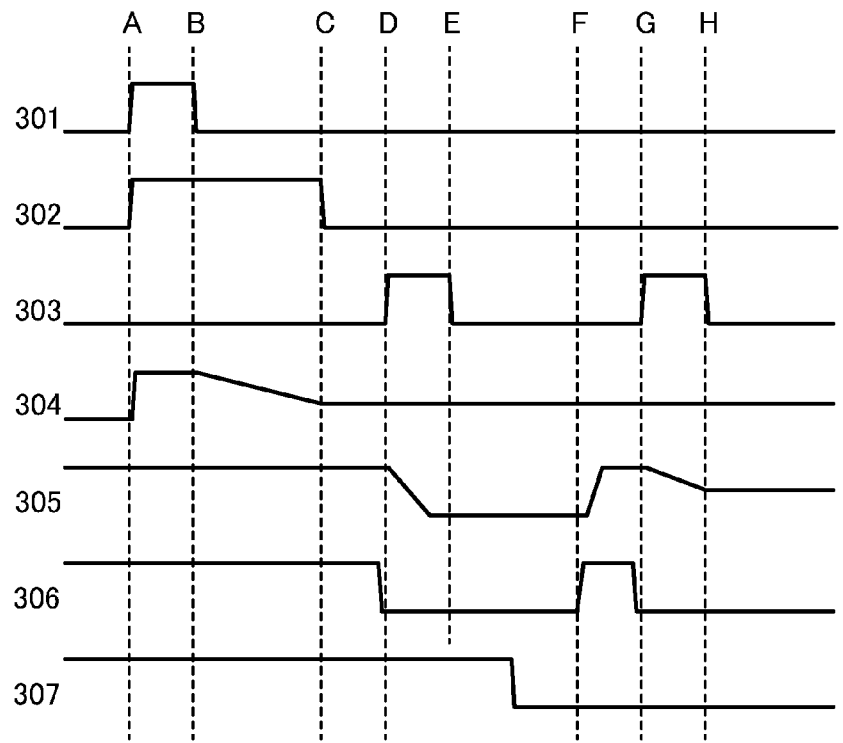
FIG. 4 is an example of a timing chart of a photosensor.

In this embodiment, an example of the operation of the semiconductor device which is illustrated in FIG. 1 or an example of the operation of the display device which is illustrated in FIG. 2 and FIG. 3 is described with reference to FIG. 4. FIG. 4 is an example of a timing chart related to the reading operation on the photosensor 106 illustrated in FIG. 1 or FIG. 2 and FIG. 3.

In FIG. 4, a signal 301, a signal 302, a signal 303, a signal 304, a signal 305, a signal 306, and a signal 307 correspond to the potentials of the photodiode reset signal line 210, the gate signal line 209, the gate signal line 211, the gate signal line 215, the photosensor output signal line 214, the precharge signal line 217, and the back gate signal line 218 in FIG. 1 or FIG. 3, respectively. Note that the photosensor reference signal line 213 is set at a low potential.

The timing chart of FIG. 4 includes a reset period during which the reset operation is performed, an accumulating period during which the charge accumulation operation is performed, and a reading period during which the reading operation is performed. A period from time A to time B corresponds to the reset period. A period from the time B to time C corresponds to the accumulation period. A period from time D to time E corresponds to a first reading period and a period from time G to time H corresponds to a second reading period.

Hereinafter, a high potential is expressed as "H" and a low potential is expressed as "L". In addition, hereinafter, an example in which a transistor is turned on when a gate of the transistor is supplied with a high potential ("H") signal. Further, hereinafter, description is made with the transistor 205 being a transistor whose threshold voltage is decreased (increased) by increasing (decreasing) the potential of a back gate.

At the time A, the potential of the photodiode reset signal line 210 (the signal 301) is set at "H" and the potential of the gate signal line 209 (the signal 302) is set at "H" (the reset operation is started); then, the photodiode 204 and the transistor 207 are brought into electrical conduction and the potential of the gate signal line 215 (the signal 304) becomes "H". Thus, charge corresponding to a high potential ("H") is stored in the gate signal line 215.

When the potential of the precharge signal line 217 (the signal 306) is "H", the potential of the photosensor output signal line 214 (the signal 305) is precharged to "H". The potential of the back gate signal line 218 (the signal 307) is 0 V and the threshold voltage of the transistor 205 is around 0 V at this time.

At the time B, the potential of the photodiode reset signal line 210 (the signal 301) is set at "L" and the potential of the gate signal line 209 (the signal 302) is kept at "H" (the reset operation is completed and the accumulation operation is started); then, the potential of the gate signal line 215 (the signal 304) starts to decrease because of the leakage current of the photodiode 204. When light is received by the photodiode 204, leakage current (also called photocurrent) is increased; therefore, the potential of the gate signal line 215 (the signal 304) is changed in accordance with the intensity of the received light (specifically the light reflected by the object). In other words, the amount of the charge in the gate signal line 215 is changed in accordance with the photocurrent generated in the photodiode 204. Thus, the amount of the charge stored in the gate of the transistor 205 is changed and channel resistance between the source and the drain of the transistor 205 is changed. When the photocurrent generated in this photodiode 204 is regarded as an electric signal, it means that the amount of the charge in the gate signal line 215 is changed in accordance with the electric signal generated in this photodiode 204.

At the time C, the potential of the gate signal line 209 (the signal 302) is set at "L" (the accumulation operation is completed), whereby the transistor 207 is turned off and the potential of the gate signal line 215 (the signal 304) becomes constant. That is, the amount of the charge stored (accumulated) in the gate signal line 215 becomes constant and the amount of the charge stored (accumulated) in the gate of the transistor 205 becomes constant. The potential (the amount of the charge) of the gate signal line 215 is determined depending on the amount of the photocurrent generated in the photodiode during the accumulation operation. In other words, the potential (the amount of the charge) of the gate signal line 215 is changed in accordance with the intensity of the light which is received by the photodiode.

The transistor 207 is a transistor with extremely low off current which uses an oxide semiconductor layer in its channel formation region. Therefore, until the subsequent reading operation is performed, the amount of the stored charge can be kept constant. As described above, the transistor 207 has a function of controlling the accumulation operation in which charge is stored (accumulated) in the gate of the transistor 205.

Note that the potential (the amount of the charge) of the gate signal line 215 is changed due to parasitic capacitance between the gate signal line 209 and the gate signal line 215 at the time of setting the potential of the gate signal line 209 (the signal 302) at "L". When the amount of change in the potential (the amount of the charge) due to the parasitic capacitance is large, reading cannot be performed accurately. In order that the amount of change in the potential (the amount of the charge) due to the parasitic capacitance be reduced, it is effective to reduce capacitance between the gate and the source (or between the gate and the drain) of the transistor 207, to increase the gate capacitance of the transistor 205, to provide the gate signal line 215 with a storage capacitor, or the like. Note that in FIG. 4, these methods are applied, and change in the potential (the amount of the charge) due to the parasitic capacitance can be thus ignored.

The transistor 205 is turned on or off depending on the potential of the gate signal line 215 (the signal 304). In the case where the intensity of the light which is received by the photodiode 204 is low, decrease in potential of the gate signal line 215 (the signal 304) from the potential "H" is small. Therefore, the transistor 205 is turned on and the channel resistance between the source and the drain is lowered. In contrast, in the case where the intensity of the light which is received by the photodiode 204 is high, decrease in potential of the gate signal line 215 (the signal 304) from the potential "H" is large. Thus, the transistor 205 exists in an off state or in a conduction state with increased channel resistance between the source and the drain. Here, the potential of the gate signal line 215 (the signal 304) after the accumulation operation (at the time C) is assumed to become a value which is able to keep the transistor 205 in an on state.

At the time D, the potential of the gate signal line 211 (the signal 303) is set at "H" (a first reading operation is started); then, the transistor 206 is turned on and the photosensor reference signal line 213 and the photosensor output signal line 214 are brought into electrical conduction through the transistor 205 and the transistor 206. Since the photosensor reference signal line 213 is set at the low potential, the potential of the photosensor output signal line 214 (the signal 305) decreases. Note that before the time D, the potential of the precharge signal line 217 (the signal 306) is set at "L" so that the precharge of the photosensor output signal line 214 is completed. Here, the rate at which the potential of the photosensor output signal line 214 (the signal 305) decreases depends on the channel resistance between the source and the drain of the transistor 205; namely, the rate is changed depending on the intensity of the light which is received by the photodiode 204 during the accumulation operation.

At the time E, the potential of the gate signal line 211 (the signal 303) is set at "L" (the first reading operation is completed); then, the transistor 206 is turned off and the potential of the photosensor output signal line 214 (the signal 305) becomes constant. The potential of the photosensor output signal line 214 here depends on the intensity of the light which is received by the photodiode 204. Thus, the intensity of the light which is received by the photodiode 204 during the accumulation operation can be determined by detecting the potential of the photosensor output signal line 214.

Here, in the case where the intensity of the light which is received by the photodiode 204 is low, the transistor 205 is turned on and the channel resistance between the source and the drain is low. Thus, decrease in potential of the photosensor output signal line 214 (the signal 305) from the potential "H" is large, and its potential becomes close to the potential of the photosensor reference signal line 213. In this case, the light cannot be distinguished from weaker light. Therefore, in order to distinguish the light from weaker light, it is possible to extend a voltage range between the potential of the photosensor reference signal line 213 and the reference potential of the photosensor output signal line 214 at the time of precharge; however, by this method, an A/D converter circuit which can operate in a wide voltage range is needed and the manufacturing cost of the semiconductor device or the display device is increased. In view of the above, a driving method described below is employed.

The potential of the back gate signal line 218 (the signal 307) is set at a negative potential before time F. At this time, the threshold voltage of the transistor 205 is higher than 0 V. At the time F, the potential of the precharge signal line 217 (the signal 306) is "H" and the potential of the photosensor output signal line 214 (the signal 305) is precharged to "H".

At the time G, the potential of the gate signal line 211 (the signal 303) is set at "H" (a second reading operation is started); then, the transistor 206 is turned on and the photosensor reference signal line 213 and the photosensor output signal line 214 are brought into electrical conduction through the transistor 205 and the transistor 206. Then, the potential of the photosensor output signal line 214 (the signal 305) decreases. Note that before the time G, the potential of the precharge signal line 217 (the signal 306) is set at "L" so that the precharge of the photosensor output signal line 214 is completed. Here, the rate at which the potential of the photosensor output signal line 214 (the signal 305) decreases depends on the channel resistance between the source and the drain of the transistor 205; namely, the rate depends on the intensity of the light which is received by the photodiode 204 during the accumulation operation. However, since the threshold voltage of the transistor 205 is higher than that at the time of the first reading operation, the rate at which the potential of the photosensor output signal line 214 (the signal 305) decreases is lowered.

At the time H, the potential of the gate signal line 211 (the signal 303) is set at "L" (the second reading operation is completed); then, the transistor 206 is turned off and the potential of the photosensor output signal line 214 (the signal 305) becomes constant. The potential of the photosensor output signal line 214 here depends on the intensity of the light which is received by the photodiode 204. Thus, the intensity of the light which is received by the photodiode 204 during the accumulation operation can be determined by detecting the potential of the photosensor output signal line 214. In this manner, even in the case where the intensity of the light is low, the intensity of the light which is received by the photodiode 204 can be detected with the use of a low-cost A/D converter circuit.

The case where the intensity of the light which is received by the photodiode is low (i.e., the light is weak) is described above; similarly, the driving method can be applied to the case where the intensity of the light which received by the photodiode is high (i.e., the light is strong). In the case where the light is strong, the potential of the photosensor output signal line 214 is almost the same as the reference potential at the time of precharge and is difficult to be detected. Therefore, as a third reading operation, the potential of the back gate signal line 218 is set at a positive potential so that the threshold voltage of the transistor 205 is lower than 0 V. Accordingly, the rate at which the potential of the photosensor output signal line 214 (the signal 305) decreases is increased and the potential of the photosensor output signal line 214 is more easily detected.

Further, in order that both the case where the light which is received by the photodiode is strong and the case where the light is weak be detected, it is effective to perform the above-described first to third reading operations repeatedly. That is, the potential of the back gate of the first transistor is set at a first potential (0 V here) and the charge stored in the gate of the first transistor is converted into a first output signal and the first output signal is read. Then, the potential of the back gate of the first transistor is set at a second potential (a negative potential here) and the charge stored in the gate of the first transistor is converted into a second output signal and the second output signal is read. After that, the potential of the back gate of the first transistor is set at a third potential (a positive potential here) and the charge stored in the gate of the first transistor is converted into a third output signal and the third output signal is read. In addition, by changing the potential of the back gate signal line 218 at the time of the second and third reading operations by a narrower voltage width and reading is sequentially performed, detection with high resolution can be performed on light in a wider range of intensity. In other words, by employing the above-described structure, the photosensor 106 can be provided which is capable of accurately converting light, regardless of the intensity thereof, into an electric signal and outputting an electric signal in accordance with a wide range of intensity of light.

In order to realize the aforementioned driving method, the potential of the gate signal line 215 in each photosensor needs to be held constant even after the accumulation operation is completed. Therefore, as described with reference to FIG. 1 or FIG. 3, a structure is effective in which the transistor 207 is formed using the oxide semiconductor layer so as to have extremely low off current.

In the above manner, the operation of individual photosensors is realized by repeating the reset operation, the accumulation operation, and the reading operation. By employing this driving method in all the pixels, imaging can be performed. More specifically, imaging can be performed by repeating the reset operation, the accumulation operation, and the reading operation per row.

According to this embodiment, a low-cost semiconductor device or a low-cost display device which is capable of realizing an imaging function with high resolution dealing with a wide range of intensity of light can be provided.

This embodiment can be implemented in combination with any of other embodiments and an example as appropriate.
(Embodiment 4)

In this embodiment, an example of a driving method of a semiconductor device including a plurality of photosensors is described.

Figure 5:
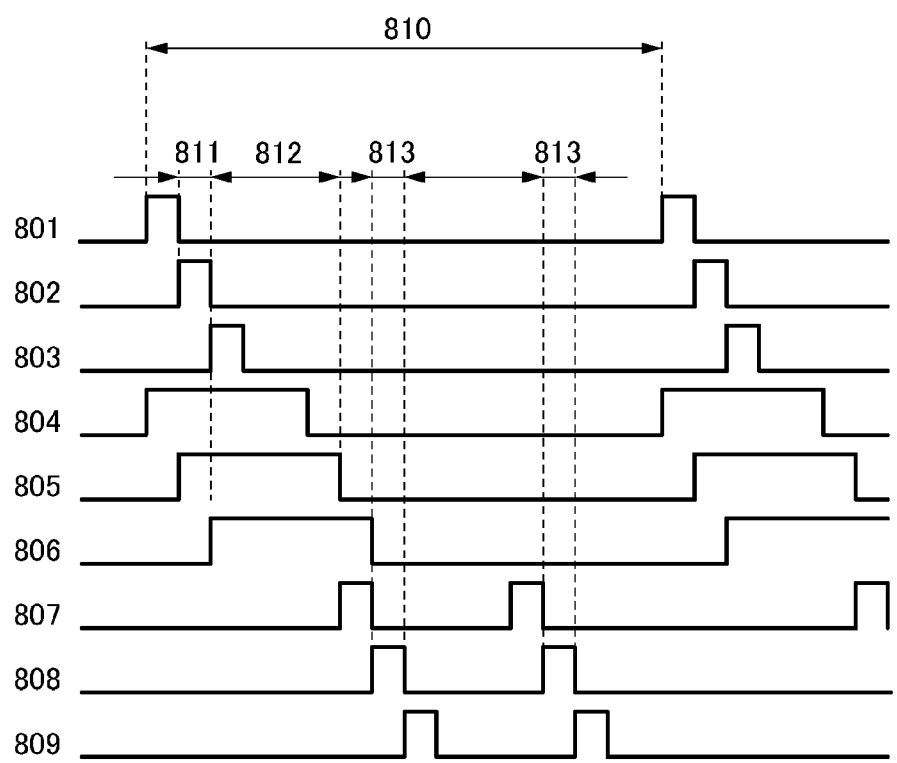
FIG. 5 is an example of a timing chart of a photosensor.

First, a driving method illustrated in the timing chart of FIG. 5 is described. In FIG. 5, a signal 801, a signal 802, and a signal 803 correspond to the photodiode reset signal lines 210 in photosensors in the first row, the second row, and the third row, respectively. A signal 804, a signal 805, and a signal 806 correspond to the gate signal lines 209 in the photosensors in the first row, the second row, and the third row, respectively. A signal 807, a signal 808, and a signal 809 correspond to the gate signal lines 211 in the photosensors in the first row, the second row, and the third row, respectively. A period 810 is a period during which imaging is performed once. A period 811 is a period during which the photosensor in the second row performs the reset operation; a period 812 is a period during which the photosensor in the second row performs the accumulation operation; and a period 813 is a period during which the photosensor in the second row performs the reading operation. By thus sequentially driving the photosensors in different rows, an image can be taken.

Here, the accumulation operations in the photosensors of different rows have a time lag between one another. That is, imaging in the photosensors in all rows is not performed simultaneously, leading to blurring of the image taken. In particular, an image of an object to be detected which moves fast is likely to be taken to have a distorted shape: if the object to be detected moves in a direction from the first row to the third row, an enlarged image is taken as if it leaves a trail behind it; and if the object to be detected moves in the opposite direction, a reduced image is taken.

In order to prevent the time lag of the accumulation operations in the photosensors in different rows, it is effective to reduce the interval between the operations of the photosensors in different rows. In that case, however, the output signal from the photosensor needs to be obtained at very high speed with an OP amplifier or an AD converter circuit, which causes an increase in power consumption. It is difficult to obtain the output signal from the photosensor with an OP amplifier or an AD converter circuit at very high speed particularly when an image with high resolution is obtained.

Figure 6:
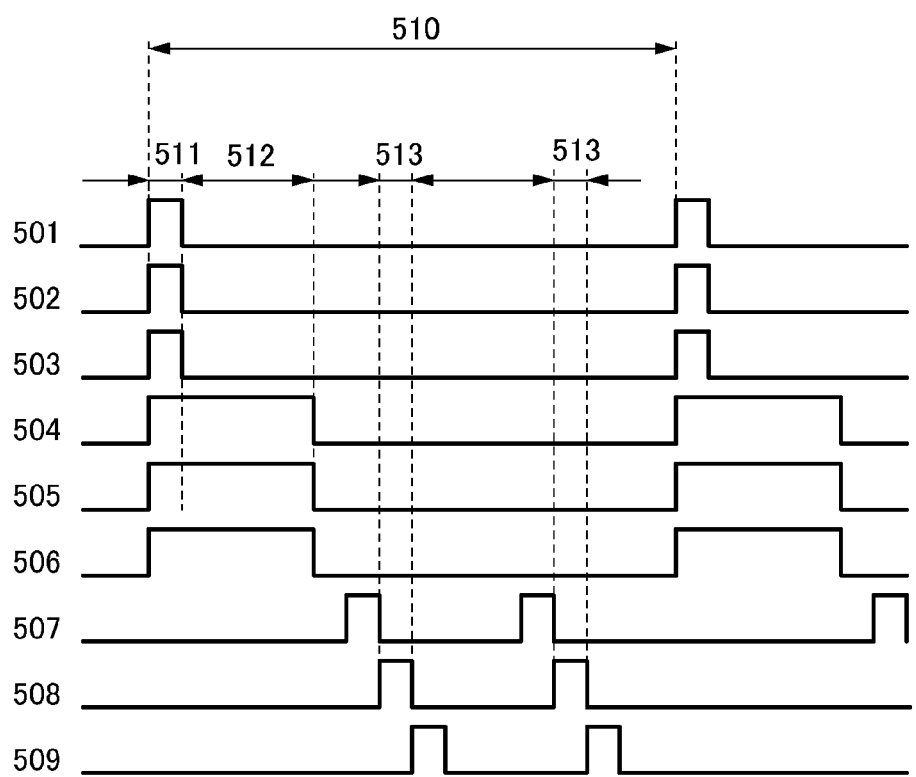
FIG. 6 is an example of a timing chart of a photosensor.

In view of the above, a driving method illustrated in the timing chart of FIG. 6 is proposed. In FIG. 6, a signal 501, a signal 502, and a signal 503 correspond to the photodiode reset signal lines 210 in the photosensors in the first row, the second row, and the third row, respectively. A signal 504, a signal 505, and a signal 506 correspond to the gate signal lines 209 in the photosensors in the first row, the second row, and the third row, respectively. A signal 507, a signal 508, and a signal 509 correspond to the gate signal lines 211 in the photosensors in the first row, the second row, and the third row, respectively. A period 510 is a period during which imaging is performed once. A period 511 is a period during which the reset operation is performed in the photosensor in the second row (at the same time as in the other rows), a period 512 is a period during which the accumulation operation is performed in the photosensor in the second row (at the same time as in the other rows), and a period 513 is a period during which the reading operation is performed in the photosensor in the second row.

FIG. 6 is different from FIG. 5 in that the reset operation and the accumulation operation are each performed simultaneously in the photosensors in all the rows, and after the accumulation operation, the reading operation is sequentially performed row by row without synchronization with the accumulation operation. When the accumulation operation is performed simultaneously, imaging in the photosensors of all rows is performed simultaneously and an image of an object to be detected can be easily taken with negligible blur even when the object to be detected moves fast. Since the accumulation operation is performed at the same time, a driver circuit can be provided in common for the photodiode reset signal lines 210 of a plurality of photosensors. A driver circuit can also be provided in common for the gate signal lines 209 of a plurality of photosensors. Such driver circuits provided in common are effective in reducing the number of peripheral circuits or reducing power consumption. In addition, the reading operation sequentially performed row by row makes it possible to decrease the operation rate of an OP amplifier or an A/D converter circuit when the output signal from the photosensor is obtained. The total time for the reading operation is preferably longer than the time for the accumulation operation, which is particularly effective in the case of obtaining an image with high resolution.

In the timing charts of FIG. 5 and FIG. 6, the periods 810 and 510 during which imaging is performed once includes a plurality of the periods 813 and 513 during which the reading operation is performed. Although two periods 813 and 513 are included in FIG. 5 and FIG. 6, three or more periods 813 and 513 during which the reading operation is performed are preferably included in the periods 810 and 510 so that both the case where the light is strong and the case where the light is weak are dealt with. A plurality of the reading operations is performed as illustrated in the timing charts of FIG. 5 and FIG. 6, in such a manner that the first reading operation is first performed row by row in all rows, the second reading operation is then performed row by row in all rows, and operation in this manner is repeated until the n-th reading operation (n is an integer greater than or equal to 3) is performed. Alternatively, the first to n-th reading operations are performed in the first row first, the first to n-th reading operations are then performed in the second row, and operation in this manner is repeated until the first to n-th reading operations are performed in the m-th row (m is an integer greater than or equal to 3).

Note that FIG. 5 and FIG. 6 illustrate the timing chart of the method for sequentially driving the photosensors row by row; it is also effective to sequentially drive the photosensor only in specified rows in order to obtain an image in a specified region. Thus, a desired image can be obtained while the operation and power consumption of the OP amplifier or the A/D converter circuit are reduced.

In order to realize the aforementioned driving method, the potential of the gate signal line 215 in each photosensor needs to be held constant even after the accumulation operation is completed. Thus, the transistor 207 is preferably formed using an oxide semiconductor so as to have extremely low off current as described with reference to FIG. 1 or FIG. 3.

In the aforementioned manner, it is possible to provide a low-power consumption display device or a low-power consumption semiconductor device which allows a high-resolution image of an object to be detected with little blur to be taken even when the object to be detected moves fast.

This embodiment can be implemented in combination with any of other embodiments and an example as appropriate.

(Embodiment 5)

In this embodiment, modified examples of the circuit structure of the photosensor 106 in FIG. 1 or FIG. 3 are described.

Figure 7A:
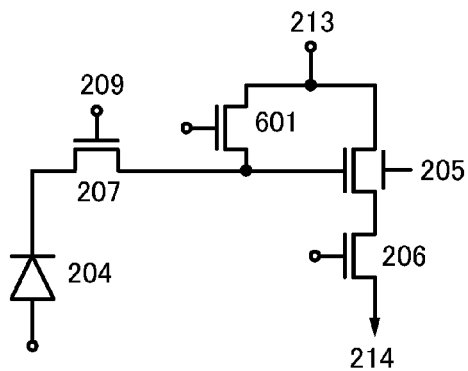
FIGS. 7A to 7D are diagrams illustrating examples of a circuit structure of a photosensor.

FIG. 7A illustrates a structure in which the gate of the transistor 205 in FIG. 1 or FIG. 3 is connected to a transistor 601 for controlling the reset operation of the photosensor. Specifically, one of a source and a drain of the transistor 601 is electrically connected to the photosensor reference signal line 213 and the other thereof is electrically connected to the gate of the transistor 205. One electrode of the photodiode 204 is electrically connected to a wiring to which a predetermined potential (e.g., a ground potential) is applied.

The transistor 601 can be formed using an amorphous semiconductor, a microcrystalline semiconductor, a polycrystalline semiconductor, an oxide semiconductor, a single crystal semiconductor, or the like. In particular, an oxide semiconductor is preferably used for the transistor 601 so that off current of the transistor 601 is low and charge of the gate of the transistor 205 is prevented from being released through the transistor 601 after the reset operation.

Figure 7B:
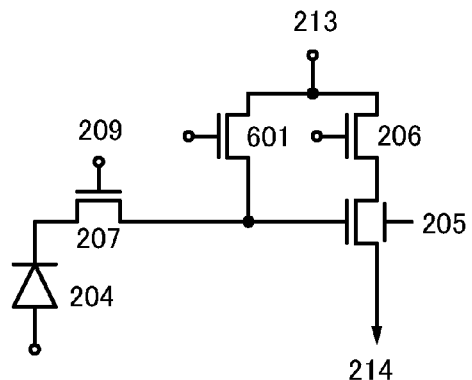

FIG. 7B illustrates a structure in which the transistor 205 and the transistor 206 are connected to be opposite to those in FIG. 7A. Specifically, one of the source and the drain of the transistor 205 is electrically connected to the photosensor output signal line 214, and one of the source and the drain of the transistor 206 is electrically connected to the photosensor reference signal line 213.

Figure 7C:
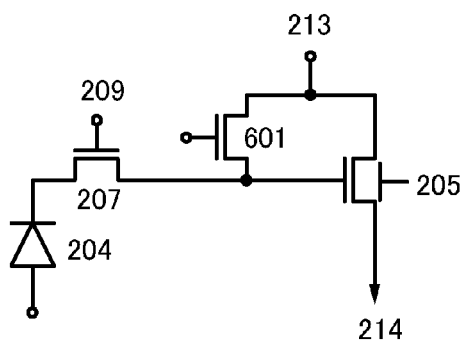

FIG. 7C illustrates a structure in which the transistor 206 is omitted from the structure in FIG. 7A. Specifically, one of the source and the drain of the transistor 205 is electrically connected to the photosensor reference signal line 213 and the other thereof is electrically connected to the photosensor output signal line 214.

Note that in FIGS. 7A to 7C, one of the source and the drain of the transistor 601 may be electrically connected to a wiring other than the photosensor reference signal line 213.

Figure 7D:
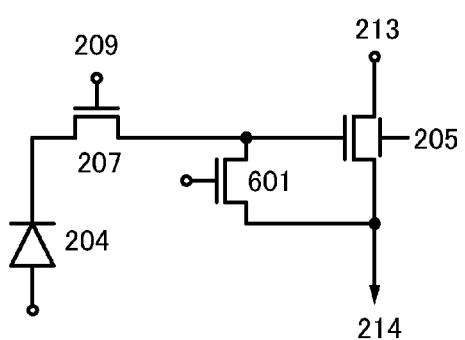

In FIG. 7D, one of the source and the drain of the transistor 601 in FIG. 7C is electrically connected to the photosensor output signal line 214 and the other thereof is electrically connected to the gate of the transistor 205.

In FIGS. 7A to 7D, when the transistor 207 is formed using an oxide semiconductor to reduce off current, the charge stored in the gate of the transistor 205 can be held constant.

In FIGS. 7A to 7D, by providing a back gate for the transistor 205, a semiconductor device capable of realizing an imaging function with high resolution and applicability to a wide range of intensity of light can be provided.

In FIGS. 7A to 7D, connection of the two electrodes of the photodiode 204 may be counterchanged depending on the circuit structure of the photosensor.

This embodiment can be implemented in combination with any of other embodiments and an example as appropriate.

(Embodiment 6)

In this embodiment, an example of a transistor included in a semiconductor device which is an embodiment of the disclosed invention is described. Specifically, an example of a transistor in which a channel formation region is formed using an oxide semiconductor layer similarly to the transistor 207 illustrated in FIG. 1 or FIG. 3 or the transistor 201 illustrated in FIG. 3 is described.

<Transistor>

The transistor (e.g., the transistor 207 illustrated in FIG. 1 or FIG. 3) is a transistor whose channel formation region is formed using an oxide semiconductor layer. The oxide semiconductor layer is highly purified to become electrically i-type (intrinsic) or substantially i-type (intrinsic) by the following way: impurities such as hydrogen, moisture, a hydroxyl group, and a hydride, which can be donors and lead to change in electrical characteristics of the transistor, are thoroughly removed to decrease their concentration as much as possible; and oxygen which is a main component of the oxide semiconductor and decreases in concentration through the step of removing the impurities is supplied. Note that the oxide semiconductor contained in the oxide semiconductor layer has a band gap of 3.0 eV or larger.

Further, the highly purified oxide semiconductor has very few carriers (close to zero) and the carrier density is extremely low (for example, lower than $1 \times 10^{12}/cm^3$, preferably lower than $1 \times 10^{11}/cm^3$). Accordingly, the off current of the transistor is extremely low. Therefore, in the aforementioned transistor, off current per micrometer of the channel width (w) at room temperature can be 1 aA/μm ($1 \times 10^{-18}$ A/μm) or lower, and further can be less than 100 zA/μm ($1 \times 10^{-19}$ A/μm). In general, in a transistor using amorphous silicon, the off current at room temperature is $1 \times 10^{-13}$ A/μm or larger. In addition, it can be considered that hot carrier deterioration does not occur in the transistor using a highly purified oxide semiconductor layer which is described above. Thus, the electrical characteristics of the transistor is not affected by hot carrier deterioration.

An oxide semiconductor layer which is highly purified by thoroughly removing hydrogen contained in the oxide semiconductor layer as described above is used in a channel formation region of a transistor, whereby a transistor with extremely low off current can be obtained. That is, in circuit design, the oxide semiconductor layer can be regarded as an insulator when the transistor is in an off state (also referred to as a non-conduction state). On the other hand, when the transistor in which the oxide semiconductor is used in a channel formation region is in an on state (a conduction state), the transistor is expected to exhibit higher current supply capability than a transistor using amorphous silicon.

It is assumed that the off current of a transistor using a low-temperature polysilicon at room temperature is approximately 10000 times as large as the off current of a transistor using an oxide semiconductor. Therefore, with the transistor using an oxide semiconductor, the charge holding period can be prolonged by approximately 10000 times as long as that of the transistor using low-temperature polysilicon.

As described above, the transistor using a highly purified oxide semiconductor layer in a channel formation region is capable of holding charge stored in a source or a drain of the transistor for a long time.

Therefore, by using an oxide semiconductor layer in the channel formation region of the transistor 207 illustrated in FIG. 1 or FIG. 3, the charge stored in the gate of the transistor 205 illustrated in FIG. 1 or FIG. 3 can be held for a long time. Accordingly, the charge stored in the gate of the transistor 205 can be held almost constant in a period during which reading of the charge stored in the gate of the transistor 205 is performed a plurality of times. Thus, by using the oxide semiconductor layer in the channel formation region of the transistor 207, a semiconductor device which includes a photosensor with a novel circuit structure can be provided.

Further, by using the oxide semiconductor layer in the channel formation region of the transistor 201 illustrated in FIG. 3, an image signal holding period of a pixel can be extended. Therefore, the size of a capacitor provided in a pixel can be reduced. Thus, the aperture ratio of the pixel can be high, and an image signal can be input to the pixel at high speed, for example. In addition, a rewriting interval of an image signal in still image display can be longer. For example, a writing interval of an image signal can be 10 seconds or longer, 30 seconds or longer, or 1 minute or longer and shorter than 10 minutes. The longer the writing interval is, the more the power consumption can be reduced.

Note that in this specification, a semiconductor with carrier concentration lower than $1\times10^{11}/cm^3$ is called an "intrinsic" ("i-type") semiconductor, and a semiconductor with carrier concentration of $1\times10^{11}/cm^3$ or higher and lower than $1\times10^{12}/cm^3$ is called a "substantially intrinsic" ("substantially i-type") semiconductor.

<Manufacturing Method of Transistor>

An example of a manufacturing method of a transistor whose channel formation region is formed using an oxide semiconductor layer is described with reference to FIGS. 8A to 8D.

FIGS. 8A to 8D are cross-sectional views illustrating an example of a structure and a manufacturing process of a transistor whose channel formation region is formed using an oxide semiconductor layer. A transistor 410 illustrated in FIG. 8D has an inverted staggered structure that is one of bottom gate structures. The transistor 410 is also a channel etched transistor with a single gate structure.

However, the structure of the transistor is not limited to the above description and may have a top gate structure. Alternatively, the transistor may be a channel stopped transistor, and the transistor may have a multigate structure.

A process for manufacturing the transistor 410 over a substrate 400 is described below with reference to FIGS. 8A to 8D.

Figure 8A:
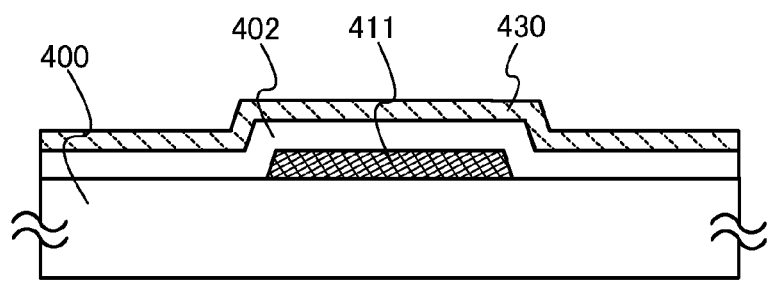
FIGS. 8A to 8D are diagrams illustrating an example of a manufacturing process of a transistor included in a semiconductor device.

First, a gate electrode layer 411 is formed over the substrate 400 which has an insulating surface (see FIG. 8A).

Although there is no particular limitation on a substrate which can be used as the substrate 400 having an insulating surface, it is necessary that the substrate have at least enough heat resistance to a heat treatment to be performed later. For example, a glass substrate can be used as the substrate 400 having an insulating surface. Further, an element substrate in which an element is formed over a glass substrate or a single crystal substrate can be used as the substrate 400 having an insulating surface. In the case where the element substrate is used, the substrate can have an insulating layer over the surface.

An insulating film serving as a base film may be provided between the substrate 400 and the gate electrode layer 411. The base film has a function of preventing diffusion of impurity elements from the substrate 400, and can be formed to have a single-layer structure or a stacked structure using one or more of a silicon nitride film, a silicon oxide film, a silicon nitride oxide film, and a silicon oxynitride film. In this embodiment, a silicon nitride film is formed to a thickness of 100 nm by a plasma CVD method and a silicon oxynitride film (a SiON film) is formed to a thickness of 150 nm by a plasma CVD method over the silicon nitride film.

Note that the base film is preferably formed so as to contain impurities such as hydrogen and water as little as possible.

The gate electrode layer 411 can be formed in such a manner that a conductive layer is formed over the substrate 400 and is selectively etched by a first photolithography step.

The gate electrode layer 411 can be formed to have a single-layer structure or a stacked structure using a metal such as molybdenum, titanium, chromium, tantalum, tungsten, aluminum, copper, neodymium, or scandium; an alloy which contains any of these metals as its main component; or a nitride which contains any of these metal elements as its main component. In this embodiment, a tungsten film is formed to a thickness of 100 nm by a sputtering method and is etched so as to form the gate electrode layer 411.

Then, a gate insulating layer 402 is formed over the gate electrode layer 411 (see FIG. 8A).

The gate insulating layer 402 can be formed with a single-layer structure or a stacked structure using one or more of a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed using a deposition gas containing silane ($SiH_4$), oxygen, and nitrogen by a plasma CVD method. Furthermore, a high-k material such as hafnium oxide ($HfO_x$) or tantalum oxide ($TaO_x$) can be used for the gate insulating layer. The thickness of the gate insulating layer 402 can be greater than or equal to 10 nm and less than or equal to 500 nm, for example.

Here, as the gate insulating layer, a silicon oxynitride film is formed to a thickness of 100 nm by a high-density plasma CVD method using a microwave (e.g., with a frequency of 2.45 GHz) over the gate electrode layer 411. It is preferable to employ a high-density plasma CVD method using a microwave because the gate insulating layer 402 can be dense and have high withstand voltage and high quality. When the oxide semiconductor layer and the high-quality gate insulating layer 402 are in contact with each other, the interface state density can be reduced and interface properties can be favorable.

Note that the gate insulating layer 402 is preferably formed so as to contain impurities such as hydrogen and water as little as possible. That is, the gate insulating layer 402 is preferably formed in such a manner that the concentration of the impurities such as hydrogen and water contained is decreased as much as possible.

Next, an oxide semiconductor film 430 is formed over the gate insulating layer 402 (see FIG. 8A). The oxide semiconductor film 430 can be formed by a sputtering method. The thickness of the oxide semiconductor film 430 can be set greater than or equal to 2 nm and less than or equal to 200 nm.

Note that before the oxide semiconductor film 430 is formed by a sputtering method, reverse sputtering in which an argon gas is introduced and plasma is generated is preferably performed. By performing reverse sputtering, powdery substances (also referred to as particles or dust) which are attached on a surface of the gate insulating layer 402 can be removed. The reverse sputtering refers to a method in which without application of voltage to the target side, an RF power source is used for application of voltage to the substrate side so that plasma is generated to modify a surface of the substrate. Note that instead of an argon atmosphere, a nitrogen atmosphere, a helium atmosphere, an oxygen atmosphere, or the like may be used.

As the oxide semiconductor film 430, an In—Ga—Zn—O-based material, an In—Sn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, an In—O-based material, a Sn—O-based material, or a Zn—O-based material can be used. In addition, the above materials may contain $SiO_2$.

The oxide semiconductor film 430 can be formed by a sputtering method in a rare gas (typically argon) atmosphere, an oxygen atmosphere, or a mixed atmosphere containing a rare gas (typically argon) and oxygen.

Here, an oxide semiconductor layer is formed to a thickness of 30 nm by a sputtering method using an In—Ga—Zn—O-based metal oxide target which contains In, Ga, and Zn. Note that a sputtering gas used contains Ar and $O_2$ and the substrate temperature is set to 200° C.

Note that the oxide semiconductor film 430 is preferably formed so as to contain impurities such as hydrogen and water as little as possible. That is, the oxide semiconductor film 430 is preferably formed in such a manner that the concentration of the impurities such as hydrogen and water contained is decreased as much as possible.

Figure 8B:
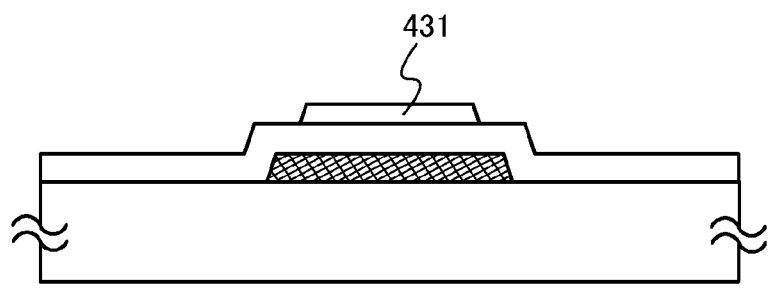

Next, the oxide semiconductor film 430 is selectively etched by a second photolithography step so that an island-shaped oxide semiconductor layer 431 is formed (see FIG. 8B). For etching the oxide semiconductor film 430, wet etching can be employed. Note that dry etching may also be used without limitation to the wet etching.

Next, a first heat treatment is performed on the oxide semiconductor layer 431. An excess amount of water, hydrogen, and the like that are contained in the oxide semiconductor layer 431 can be removed by the first heat treatment. The temperature of the first heat treatment can be higher than or equal to 350° C. or higher and lower than the strain point of the substrate, preferably 400° C. or higher and lower than the strain point of the substrate.

The first heat treatment at temperatures of 350° C. or higher allows dehydration or dehydrogenation of the oxide semiconductor layer, resulting in a reduction in the hydrogen concentration in the layer. The first heat treatment at temperatures of 450° C. or higher allows a further reduction in the hydrogen concentration in the layer. The first heat treatment at temperatures of 550° C. or higher allows a still further reduction in the hydrogen concentration in the layer.

As the atmosphere in which the first heat treatment is performed, it is preferable to use an inert gas that contains nitrogen or a rare gas (e.g., helium, neon, or argon) as its main component and that does not contain water, hydrogen, or the like. For example, the purity of the gas introduced to the heat treatment apparatus can be 6N (99.9999%) or more, preferably 7N (99.99999%) or more. In this manner, the oxide semiconductor layer 431 is not exposed to the air during the first heat treatment so that the entry of water or hydrogen can be prevented.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for a heat treatment using a high-temperature gas. As the gas, an inert gas which does not react with an object to be processed by a heat treatment, such as nitrogen or a rare gas such as argon is used.

In this embodiment, a heat treatment is performed using a GRTA apparatus in a nitrogen atmosphere at 650° C. for 6 minutes as the first heat treatment.

The first heat treatment performed on the oxide semiconductor layer may be performed on the oxide semiconductor film 430 which has not yet been processed into the island-shaped oxide semiconductor layer. In that case, the second photolithography step is performed after the first heat treatment.

Figure 8C:
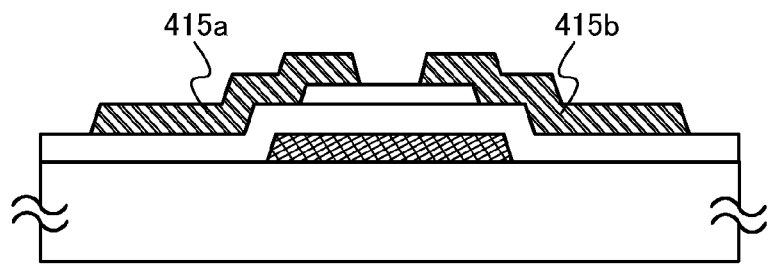

After that, a conductive layer is formed so as to cover the gate insulating layer 402 and the oxide semiconductor layer 431 and is etched by a third photolithography step, so that the source/drain electrode layers 415a and 415b are formed (see FIG. 8C).

As a material for the conductive layer, a metal selected from aluminum, chromium, copper, tantalum, titanium, molybdenum, and tungsten; a nitride containing any of these metal elements as a component; an alloy containing any of these metals as a component; or the like can be used. A material selected from manganese, magnesium, zirconium, beryllium, and yttrium also may be used. Aluminum containing one or more of metals selected from titanium, tantalum, tungsten, molybdenum, chromium, neodymium, and scandium may be used.

The conductive layer may be formed using an oxide conductive film. As the oxide conductive film, indium oxide ($In_2O_3$), tin oxide ($SnO_2$), zinc oxide (ZnO), a mixed oxide of indium oxide and tin oxide ($In_2O_3$—$SnO_2$, which is abbreviated to ITO in some cases), a mixed oxide of indium oxide and zinc oxide ($In_2O_3$—ZnO), or any of these oxide conductive materials which contains silicon or silicon oxide can be used.

In that case, as a material of the oxide conductive film, a material whose conductivity is high or whose resistivity is low as compared with a material used for the oxide semiconductor layer 431 is preferably used. The conductivity of the oxide conductive film can be increased by an increase in the carrier concentration. The carrier concentration in the oxide conductive film can be increased by increasing hydrogen concentration or oxygen deficiency.

The source/drain electrode layers 415a and 415b can have a single-layer structure or a stacked structure including two or more layers.

In this embodiment, a first titanium layer having a thickness of 100 nm, an aluminum layer having a thickness of 400 nm, and a second titanium layer having a thickness of 100 nm are formed in this order over the oxide semiconductor layer 431. Then, the stacked-layer film including the first titanium layer, the aluminum layer, and the second titanium layer is etched so that the source/drain electrode layers 415a and 415b are formed (see FIG. 8C).

The first heat treatment performed on the oxide semiconductor layer may be performed after the source/drain electrode layers are formed. In the case where the first heat treatment is performed after the source/drain electrode layers are formed, a conductive layer having heat resistance for this heat treatment is employed.

Note that materials and etching conditions are adjusted as appropriate so that the oxide semiconductor layer 431 is not removed by etching of the conductive layer.

Note that, in the third photolithography step, part of the oxide semiconductor layer 431 is etched, whereby an oxide semiconductor layer having a groove (a depressed portion) is formed in some cases.

Next, a plasma treatment using a gas such as nitrous oxide ($N_2O$), nitrogen ($N_2$), or argon (Ar) is performed. By this plasma treatment, absorbed water and the like attached to an exposed surface of the oxide semiconductor layer are removed. A plasma treatment may be performed using a mixed gas of oxygen and argon.

Figure 8D:
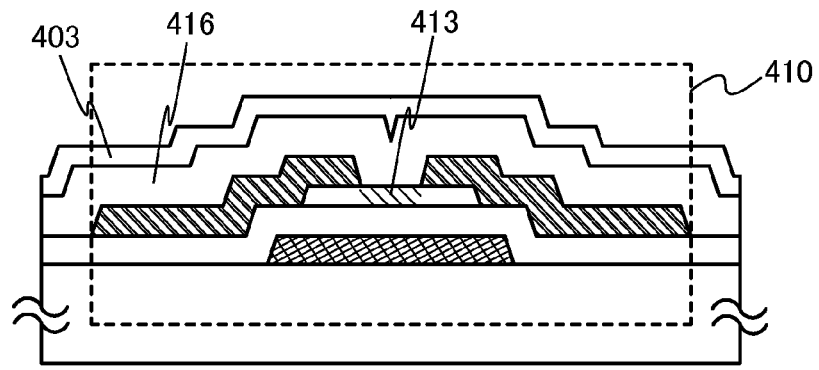

After the plasma treatment, an oxide insulating layer 416 which serves as a protective insulating film and is in contact with part of the oxide semiconductor layer is formed without exposure of the oxide semiconductor layer to the air (see FIG. 8D).

The oxide insulating layer 416 can be formed by a method such as a sputtering method, by which impurities such as hydrogen and water are prevented from entering the oxide insulating layer 416. The thickness of the oxide insulating layer 416 can be at least 1 nm or more. When hydrogen is contained in the oxide insulating layer 416, there is a possibility that entry of the hydrogen to the oxide semiconductor layer 431 is caused, a back channel of the oxide semiconductor layer 431 is made to have lower resistance (have n-type conductivity), and a parasitic channel is formed. Therefore, it is important that a formation method in which hydrogen is not used is employed in order to form the oxide insulating layer 416 containing as little hydrogen as possible.

The substrate temperature at the time of deposition of the oxide insulating layer 416 may be higher than or equal to room temperature and lower than or equal to 300° C. The atmosphere in which the oxide insulating layer 416 is formed can be a rare gas (typically argon) atmosphere, an oxygen atmosphere, or a mixed atmosphere of a rare gas (typically argon) and oxygen.

In this embodiment, the substrate is heated at 200° C. before the oxide insulating layer 416 is formed and a silicon oxide film as the oxide insulating layer 416 is formed to a thickness of 300 nm so as to cover the source/drain electrode layers 415a and 415b. The silicon oxide film is formed by a sputtering method using a silicon target and oxygen as a sputtering gas.

Next, a second heat treatment is performed in an inert gas atmosphere or an oxygen gas atmosphere (preferably at temperatures higher than or equal to 200° C. and lower than or equal to 400° C., for example at temperatures higher than or equal to 250° C. and lower than or equal to 350° C.). For example, the second heat treatment is performed at 250° C. for 1 hour in a nitrogen atmosphere. Through the second heat treatment, part of the oxide semiconductor layer (a channel formation region) is heated while being in contact with the oxide insulating layer 416. By the second heat treatment, oxygen is supplied to the part of the oxide semiconductor layer (the channel formation region). Thus, the conductivity type of a channel formation region 413 which overlaps with the gate electrode layer 411 can be made to close to an i-type. Through the above-described steps, the transistor 410 is formed.

A protective insulating layer 403 may be formed over the oxide insulating layer 416 (see FIG. 8D). For example, a silicon nitride film can be formed by an RF sputtering method. Since an RF sputtering method has high productivity, it is preferably used as a film formation method of the protective insulating layer. It is preferable that the protective insulating layer do not contain impurities such as moisture, hydrogen ions, and OH⁻ and be formed using an inorganic insulating film which prevents entry of these species from the outside.

Further, a heat treatment may be performed at temperatures higher than or equal to 100° C. and lower than or equal to 200° C. for longer than or equal to 1 hour and shorter than or equal to 30 hours in the air. This heat treatment may be performed at a fixed heating temperature. Alternatively, the following change in the heating temperature may be repeated plural times: the heating temperature is increased from room temperature to predetermined temperatures higher than or equal to 100° C. and lower than or equal to 200° C., and then decreased to room temperature. This heat treatment may be performed before formation of the oxide insulating film under reduced pressure. When the heat treatment is performed under reduced pressure, the heat treatment time can be shortened. By the heat treatment, hydrogen can be taken in the oxide insulating layer 416 from the oxide semiconductor layer 431. In other words, more hydrogen can be removed from the oxide semiconductor layer.

A gate bias-temperature stress test (BT test) under conditions such as 85° C., $2\times10^6$ V/cm, and 12 hours does not show any change in the electrical characteristics, which means that stable electrical characteristics are obtained.

The transistor using the oxide semiconductor which is described in this embodiment has an electric characteristic of extremely low off current when compared with a transistor using silicon or the like.

Therefore, by using the transistor described in this embodiment as the transistor 207 illustrated in FIG. 1 or FIG. 3, the charge stored in the gate of the transistor 205 illustrated in FIG. 1 or FIG. 3 can be held for a long time. Accordingly, the charge stored in the gate of the transistor 205 can be held almost constant during a period during which reading of the charge stored in the gate of the transistor 205 is performed a plurality of times. Thus, by using the oxide semiconductor layer in the channel formation region of the transistor 207, a semiconductor device which includes a photosensor with a novel circuit structure can be provided.

Further, by using the transistor described in this embodiment as the transistor 201 illustrated in FIG. 3, an image signal holding period of a pixel can be extended. Therefore, the size of a capacitor provided in a pixel can be reduced. Thus, the aperture ratio of the pixel can be high, and an image signal can be input to the pixel at high speed, for example. In addition, a rewriting interval of an image signal in still image display can be longer. For example, a writing interval of an image signal can be 10 seconds or longer, 30 seconds or longer, or 1 minute or longer and shorter than 10 minutes. The longer the writing interval is, the more the power consumption can be reduced.

In addition, by using the transistor described in this embodiment as the transistor 206 illustrated in FIG. 1 or FIG. 3, an unnecessary potential can be prevented from being output to the photosensor output signal line 214 illustrated in FIG. 3 during a reading period for another pixel.

Further, the transistor described in this embodiment to which a back gate is added can be used as the transistor 205 illustrated in FIG. 1 or FIG. 3. Thus, an unnecessary potential can be prevented from being output to the photosensor output signal line 214 during a reading period for another pixel.

Figure 9:
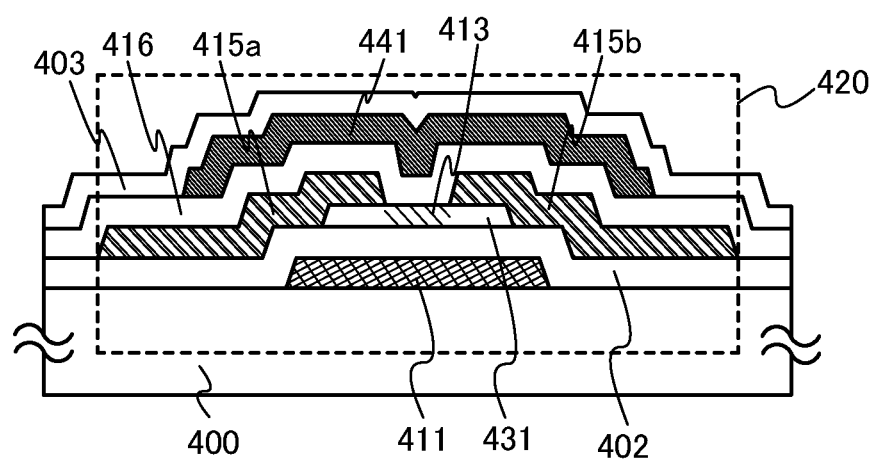
FIG. 9 is a diagram illustrating an example of a structure of a transistor included in a semiconductor device.

An example of a cross-sectional view of the transistor provided with the back gate is illustrated in FIG. 9. A transistor 420 illustrated in FIG. 9 has a structure of the transistor 410 illustrated in FIG. 8D to which a back gate 441 is added. That is, the transistor 420 illustrated in FIG. 9 includes, over the substrate 400 having an insulating surface, a gate electrode layer 411, the gate insulating layer 402, the oxide semiconductor layer 431 having the channel formation region 413, the source/drain electrode layers 415a and 415b, the oxide insulating layer 416, the back gate 441, and the protective insulating layer 403.

The back gate 441 can be formed using a material similar to the material which can be used for the gate electrode layer 411. The oxide insulating layer 416 which is provided between the back gate 441 and the channel formation region can function as a gate insulating layer on the back gate 441 side. Therefore, the thickness of the oxide insulating layer 416 can be approximately the same as that of the gate insulating layer 402. Other parts of the structure can be similar to those of the transistor 410 illustrated in FIG. 8D.

This embodiment can be implemented in combination with any of other embodiments and an example as appropriate.

EXAMPLE 1

In this example, evaluation of a transistor using an oxide semiconductor which is included in a semiconductor device of an embodiment of the disclosed invention is described with reference to FIG. 10. In this example, measured values of the off current using a test element group (also referred to as a TEG) are described below.

The test element group was manufactured by connecting 200 transistors each with a relationship between the length and width of the channel formation region of L/W=3 µm/50 µm in parallel. This test element group corresponds to a transistor with L/W=3 µm/10000 µm. The initial characteristics of the transistor manufactured as the test element group are shown in FIG. 10. In the transistor, a highly purified oxide semiconductor layer is used in the channel formation region. Note that a length ($L_{ov}$) of a region where a source electrode layer or a drain electrode layer overlaps with the oxide semiconductor layer, in a channel length direction was 1.5 µm.

In order to measure the initial characteristics of the transistor, the $V_g$–$I_d$ characteristics were evaluated by measuring the change in source-drain current (hereinafter, referred to as drain current or $I_d$) under the conditions where the substrate temperature was room temperature, the voltage between the source and the drain (hereinafter, referred to as drain voltage or $V_d$) was 1 V or 10 V, and the voltage between the source and the gate (hereinafter, referred to as a gate voltage or $V_g$) was changed from −20 V to +20 V. Note that, in FIG. 10, the $V_g$–$I_d$ characteristics are shown in the range of $V_g$ from −20 V to +5 V.

Figure 10:
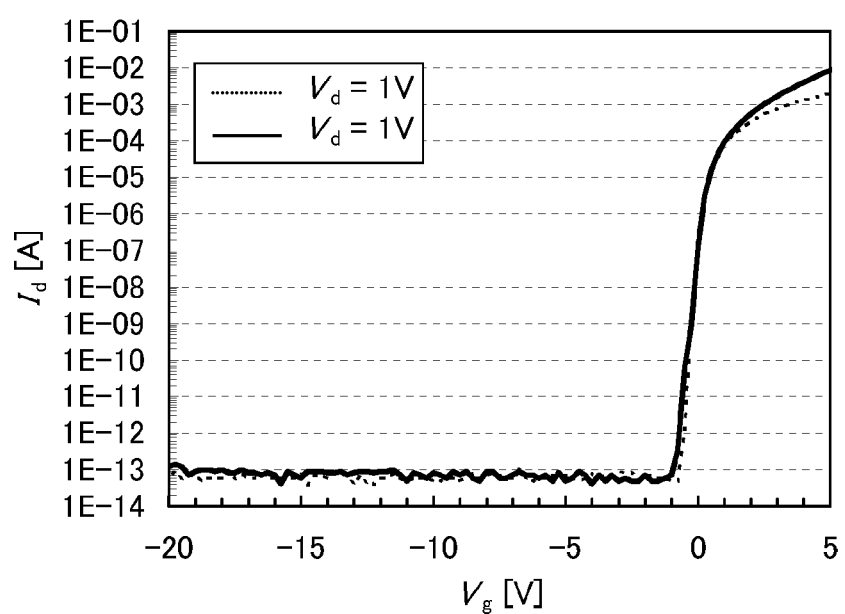
FIG. 10 is a graph illustrating an example of a $V_g$–$I_d$ characteristic of the transistor.

As illustrated in FIG. 10, the transistor with a channel width W of 10000 µm has off current of $1\times10^{-13}$ [A] or less at $V_d$ of 1 V and 10 V, which is less than or equal to the detection limit of a measurement device (a semiconductor parameter analyzer, Agilent 4156C manufactured by Agilent Technologies Inc.). That is, it can be confirmed that off current of the transistor per 1 µm of channel width is 10 aA/µm or lower. In addition, in the case where the channel length is 3 µm or more, off current of the transistor is estimated to 10 aA/µm or lower.

Further, a transistor with a channel width W of 1000000 µm (1 m) was manufactured and subjected to the test. As a result, it was observed that off current was $1\times10^{-12}$ [A] or less, which is near the detection limit. That is, it was revealed that off current of the transistor per 1 µm of channel width is 1 aA/µm or lower.

The reason for the low off current of the transistor as low as $1\times10^{-13}$ [A] as shown in FIG. 10 is that hydrogen concentration in the oxide semiconductor layer is sufficiently reduced in the above manufacturing process.

The carrier density of the oxide semiconductor layer which is measured by a carrier measurement device is lower than $1\times10^{12}/cm^3$ or lower than $1\times10^{11}/cm^3$. That is, the carrier density of the oxide semiconductor layer can be made as close to zero as possible.

Accordingly, the channel length L of the transistor can be greater than or equal to 10 nm and less than or equal to 1000 nm. Thus, operation rate of a circuit can be increased. Further, since the off current is extremely low, the power consumption can be reduced.

In addition, in circuit design, the oxide semiconductor layer can be regarded as an insulator when the transistor is in an off state.

A transistor using a highly purified oxide semiconductor (purified OS) as described above shows almost no dependence of off current on temperature. It is considered that an oxide semiconductor does not show temperature dependence when purified because the conductivity type is made to extremely close to an intrinsic type and the Fermi level is located in the middle of the forbidden band. This feature also results from the fact that the oxide semiconductor has a large band gap and includes very few thermally excited carriers.

The above-described results show that off current of a transistor whose carrier density is lower than $1\times10^{12}/cm^3$ or $1\times10^{11}/cm^3$ is 1 aA/µm or lower in room temperature. In addition, by applying this transistor as a transistor included in a semiconductor device, a semiconductor device including a photosensor with a novel circuit structure can be provided. Further, power consumption of the semiconductor device can be reduced and display degradation (reduction in display quality) can be suppressed. Moreover, a semiconductor device can be provided in which display degradation (display change) due to an external factor such as temperature can be reduced.

This application is based on Japanese Patent Application serial no. 2010-028762 filed with Japan Patent Office on Feb. 12, 2010, the entire contents of which are hereby incorporated by reference.

EXPLANATION OF REFERENCE

100: display device, 101: pixel circuit, 102: display element control circuit, 103: photosensor control circuit, 104: pixel, 105: display element, 106: photosensor, 107: display element driver circuit, 108: display element driver circuit, 109: photosensor reading circuit, 110: photosensor driver circuit, 200: precharge circuit, 201: transistor, 202: storage capacitor, 203: liquid crystal element, 204: photodiode, 205: transistor, 206: transistor, 207: transistor, 208: gate signal line, 209: gate signal line, 210: photodiode reset signal line, 211: gate signal line, 212: video data signal line, 213: photosensor reference signal line, 214: photosensor output signal line, 215: gate signal line, 216: transistor, 217: precharge signal line, 218: back gate signal line, 301: signal, 302: signal, 303: signal, 304: signal, 305: signal, 306: signal, 307: signal, 400: substrate, 402: gate insulating layer, 403: protective insulating layer, 410: transistor, 411: gate electrode layer, 413: channel formation region, 416: oxide insulating layer, 420: transistor, 430: oxide semiconductor film, 431: oxide semiconductor layer, 441: back gate, 415a: source/drain electrode layer, 415b: source/drain electrode layer, 501: signal, 502: signal, 503: signal, 504: signal, 505: signal, 506: signal, 507: signal, 508: signal, 509: signal, 510: period, 511: period, 512: period, 513: period, 601: transistor, 801: signal, 802: signal, 803: signal, 804: signal, 805: signal, 806: signal, 807: signal, 808: signal, 809: signal, 810: period, 811: period, 812: period, and 813: period

The invention claimed is:

1. A semiconductor device comprising a pixel circuit comprising a plurality of pixels, each of the plurality of pixels comprising:
   a display element; and
   a photosensor,
   wherein the photosensor comprises:
      a photodiode;
      a first transistor having a stacked structure including a gate, a gate insulating layer, a semiconductor layer, an insulating film, and a back gate; and
      a second transistor comprising a gate, a first terminal, and a second terminal,
   wherein the photodiode is electrically connected to the first terminal of the second transistor, and
   wherein the second terminal of the second transistor is electrically connected to the gate of the first transistor.

2. The semiconductor device according to claim 1, wherein the display element comprises a liquid crystal element.

3. The semiconductor device according to claim 1, wherein the display element comprises a light emitting element.

4. The semiconductor device according to claim 1, wherein the second transistor comprises an oxide semiconductor.

5. The semiconductor device according to claim 4, wherein the oxide semiconductor comprises indium, gallium, and zinc.

6. An electronic appliance comprising the semiconductor device according to claim 1.

7. The semiconductor device according to claim 1, wherein the first transistor comprises an oxide semiconductor.

8. A semiconductor device comprising a pixel circuit comprising a plurality of pixels, each of the plurality of pixels comprising:
   a display element; and
   a photosensor,
   wherein the photosensor comprises:
      a photodiode comprising a pair of electrodes with a semiconductor interposed between the pair of electrodes;
      a first transistor having a stacked structure including a gate, a gate insulating layer, a semiconductor layer, an insulating film, and a back gate, the gate insulating layer and the semiconductor layer being interposed between the gate and the back gate; and
      a second transistor comprising:
         a second gate;
         a gate insulating layer over the second gate;
         a semiconductor layer over the gate insulating layer;
         a first terminal and a second terminal over the semiconductor layer; and
         an oxide insulating layer over and in contact with the first terminal, the second terminal, and the semiconductor layer of the second transistor,
   wherein one of the pair of electrodes is electrically connected to one of the first terminal and the second terminal, and
   wherein the other of the first terminal and the second terminal is electrically connected to the gate of the first transistor.

9. The semiconductor device according to claim 8, wherein the display element comprises a liquid crystal element.

10. The semiconductor device according to claim 8, wherein the display element comprises a light emitting element.

11. The semiconductor device according to claim 8, wherein the semiconductor layer of the second transistor comprises an oxide semiconductor.

12. The semiconductor device according to claim 11, wherein the semiconductor layer of the first transistor comprises the oxide semiconductor included in the semiconductor layer of the second transistor.

13. The semiconductor device according to claim 11, wherein the oxide semiconductor comprises indium, gallium, and zinc.

14. An electronic appliance comprising the semiconductor device according to claim 8.

15. A driving method of a semiconductor device comprising a plurality of pixels each of which comprises a display element and a photosensor, the driving method comprising the steps of:
   transferring an electric signal generated by a photodiode to a gate of a first transistor through a second transistor which is in a conduction state, keeping a back gate of the first transistor at a first potential, wherein the photodiode, the first transistor, and the second transistor are included in the photosensor;
   holding charge stored in the gate by turning the second transistor to a non-conduction state;
   converting the charge stored in the gate of the first transistor to a first output signal;
   providing a second potential to the back gate, wherein the second potential is different from the first potential; and
   converting the charge stored in the gate to a second output signal, while keeping the back gate at the second potential,
   wherein the back gate is provided over the gate with a semiconductor layer therebetween.

16. The driving method according to claim 15, wherein the second transistor comprises a channel formation region comprising an oxide semiconductor.

17. The driving method according to claim 16, wherein the oxide semiconductor comprises indium, gallium, and zinc.

18. The driving method according to claim 15, wherein the display element comprises a liquid crystal element.

19. The driving method according to claim 15, wherein the display element comprises a light emitting element.

20. The driving method according to claim 15, wherein the first transistor comprises a channel formation region comprising an oxide semiconductor.

* * * * *